(12) United States Patent
Bose et al.

(10) Patent No.: US 10,333,520 B2
(45) Date of Patent: *Jun. 25, 2019

(54) ON-CHIP SUPPLY NOISE VOLTAGE REDUCTION OR MITIGATION USING LOCAL DETECTION LOOPS IN A PROCESSOR CORE

(71) Applicant: International Business Machines Corporation, Armonk, NY (US)

(72) Inventors: Pradip Bose, Yorktown Heights, NY (US); Alper Buyuktosunoglu, White Plains, NY (US); Pierce I-Jen Chuang, Briarcliff Manor, NY (US); Phillip John Restle, Katonah, NY (US); Christos Vezyrtzis, New Rochelle, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/842,482

(22) Filed: Dec. 14, 2017

(65) Prior Publication Data
US 2019/0036530 A1    Jan. 31, 2019

Related U.S. Application Data

(63) Continuation of application No. 15/663,033, filed on Jul. 28, 2017.

(51) Int. Cl.
*H03K 17/16* (2006.01)
*H03K 19/003* (2006.01)

(52) U.S. Cl.
CPC ..... *H03K 19/00361* (2013.01); *H03K 17/162* (2013.01); *H03K 19/00384* (2013.01)

(58) Field of Classification Search
CPC .......... H03K 19/00361; H03K 17/162; H03K 19/00384
(Continued)

(56) References Cited

U.S. PATENT DOCUMENTS 5,565,816 A    10/1996 Coteus
5,774,007 A    6/1998 Soneda
(Continued)

OTHER PUBLICATIONS

Thomas et al., "Core Tunneling: Variation-Aware Voltage Noise Mitigation in GPUs*," IEEE International Symposium on High Performance Computer Architecture (HPCA), Mar. 2016, pp. 151-162, IEEE, 12 pages.
(Continued)

*Primary Examiner* — Don P Le
(74) *Attorney, Agent, or Firm* — Amin, Turocy & Watson, LLP

(57) ABSTRACT

Techniques facilitating on-chip supply noise voltage reduction and/or mitigation using local detection loops in a processor core are provided. In one example, a computer-implemented method can comprise detecting, by a processor core, a voltage droop at a first area of the processor core. The computer-implemented method can also comprise transmitting, by the processor core, voltage droop information to a local controller located in the first area and to a global controller located in the processor core. Further, the computer-implemented method can comprise applying, by the processor core, a first mitigation countermeasure at the first area of the processor core in response to a local instruction received from the local controller. The local instruction can comprise an indication of the first mitigation countermeasure.

6 Claims, 10 Drawing Sheets

(58) Field of Classification Search
 USPC .......................................................... 326/27
 See application file for complete search history.

(56) References Cited

U.S. PATENT DOCUMENTS

| | | | |
|---|---|---|---|
| 6,842,027 | B2 | 1/2005 | Liu et al. |
| 8,269,544 | B2 | 9/2012 | Greenhill et al. |
| 8,604,852 | B1 | 12/2013 | Turullols et al. |
| 9,164,563 | B2 | 10/2015 | Berry, Jr. et al. |
| 9,276,460 | B2 | 3/2016 | Telefus |
| 2004/0066208 | A1 | 4/2004 | Liu et al. |
| 2007/0283172 | A1 | 12/2007 | Douriet et al. |
| 2012/0187991 | A1 | 7/2012 | Sathe et al. |
| 2013/0049828 | A1 | 2/2013 | Kim et al. |
| 2013/0169350 | A1 | 7/2013 | Whatmough et al. |
| 2014/0277812 | A1* | 9/2014 | Shih .................. G05F 1/563 700/298 |
| 2016/0034014 | A1 | 2/2016 | Turullols et al. |
| 2016/0098070 | A1 | 4/2016 | Curran et al. |
| 2016/0342185 | A1 | 11/2016 | Rodriguez et al. |
| 2017/0038814 | A1 | 2/2017 | Pal |
| 2017/0153916 | A1 | 6/2017 | Xu et al. |
| 2018/0067532 | A1 | 3/2018 | Chuang et al. |
| 2018/0067541 | A1 | 3/2018 | Chuang et al. |

OTHER PUBLICATIONS

Ozanoglu et al., "Effects of the Positive Feedback Loop in Self Biased Bandgap Reference Circuits," IFIP/IEEE 21st International Conference on Very Large Scale Integration (VLSI-SoC), Oct. 2013, pp. 50-51, IEEE, 2 pages.

Lefurgy et al., "Active Guardband Management in Power7+ to Save Energy and Maintain Reliability," IEEE Micro, 2013, pp. 35-45, vol. 33, No. 4, IEEE Computer Society, 11 pages.

Anonymous, "A Method for Mitigating On-Chip Supply Voltage Noise by Boosting the Supply Voltage through Capacitive Coupling," Nov. 10, 2016, IPCOM000248242D, http://ip.com/IPCOM/000248242, 4 pages.

Office Action for U.S. Appl. No. 15/663,033 dated Mar. 27, 2018, 21 pages.

International Search Report and Written Opinion for International Application Serial. No. PCT/IB2018/055630 dated Nov. 22, 2018, 11 pages.

* cited by examiner

ON-CHIP SUPPLY NOISE VOLTAGE REDUCTION OR MITIGATION USING LOCAL DETECTION LOOPS IN A PROCESSOR CORE

BACKGROUND

The subject disclosure relates to on-chip supply noise voltage reduction or mitigation, and more specifically, on-chip supply noise voltage reduction or mitigation using local detection loops in a processor core.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatus and/or computer program products that facilitate supply noise voltage reduction and/or mitigation are described.

According to an embodiment, a computer-implemented method can comprise detecting, by a processor core, a voltage droop at a first area of the processor core. The computer-implemented method can also comprise transmitting, by the processor core, voltage droop information to a local controller located in the first area and to a global controller located in the processor core. Further, the computer-implemented method can comprise applying, by the processor core, a first mitigation countermeasure at the first area of the processor core in response to a local instruction received from the local controller. The local instruction can comprise an indication of the first mitigation countermeasure.

According to an embodiment, a device can comprise a first voltage noise sensor located at a first unit of a processor core. The first voltage noise sensor can detect a first voltage droop at the first unit. Further, the processor core can be divided into the first unit and a second unit. The device can also comprise a global noise manager component located in the processor core and that receives, from the first voltage noise sensor, an indication of the first voltage droop. Further, the device can comprise a first local noise manager component located in the first unit and that receives, from the first voltage noise sensor, the indication of the first voltage droop and implements a first noise mitigation procedure at the first unit.

According to another embodiment, a computer program product that facilitates reduction of on-chip power supply noise can comprise a computer readable storage medium having program instructions embodied therewith. The program instructions can be executable by a processor core. The program instructions can cause the processor core to detect a first voltage droop at a first segment of the processor core. The program instructions can also cause the processor core to transmit a first indication of the first voltage droop to a local noise management unit and a common noise management unit. The local noise management unit can be associated with the first segment of the processor core. Further, the program instructions can cause the processor core to execute a first sequence of instructions based on the first indication of the first voltage droop. The first sequence of instructions can be received from the local noise management unit and can relate to a mitigation countermeasure associated with the first voltage droop.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Integrated circuits (e.g., processors) can receive power from a power source, such as a power supply, to provide a source voltage for the associated circuitry. The amount of current and the amount of circuit loading can be a function of an operating speed of the associated circuitry and the power supply voltage. Due to the active nature of the circuits, the circuit loading can vary, which can cause a supply voltage level to drop or to fall below a defined voltage level. The drop in voltage from the defined voltage level is referred to as "voltage droop." For example, power supply noise can be generated from the power source and, further, can be propagated to the associated circuitry, which can cause voltage droops in various paths or units of a processor. The voltage droop (or more than one voltage droop) can affect the speed at which the processor operates.

The various aspects discussed herein relate to facilitating reduction and/or mitigation of the effect of on-chip power supply noise by preventing timing failures in the case of large and sudden increases in supply current. The timing failures can occur due to a lag time between when a voltage droop is detected and when a mitigation countermeasure is applied to compensate for the voltage droop. Thus, the disclosed aspects can provide, for a processor core, one or more inner or local (e.g., fast) control loops in a first portion or first unit of the processor core, and one or more outer or global (e.g., slow) control loops in the processor core. The local control loop(s) and/or global control loop(s) can be utilized to detect various dangerous events on the power supply voltage rail. Furthermore, the one or more control loops (local and/or global) can respond in a different manner than other control loops (or the same as other loops in some implementations), to reduce or minimize the performance impact of voltage droop reduction/mitigation. Accordingly, the one or more embodiments provided herein can facilitate a reduction or mitigation of power consumption of a processor chip by reducing the applied voltage margin.

Figure 1:
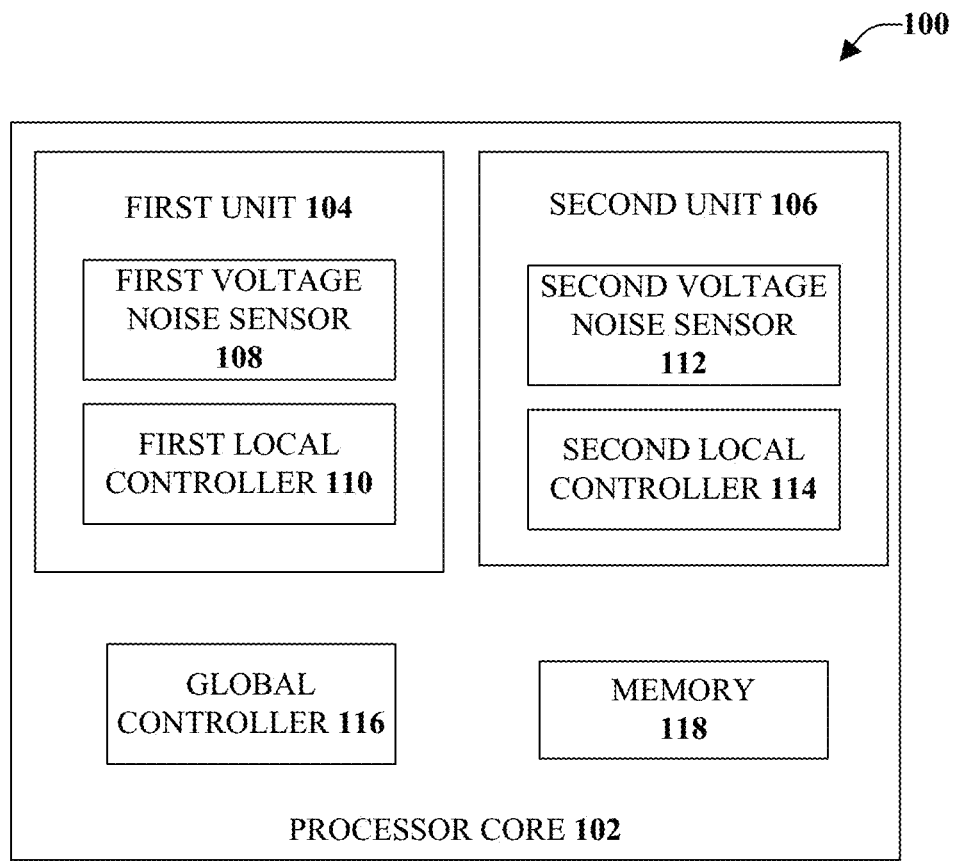
FIG. 1 illustrates a block diagram of an example, non-limiting, system that facilitates on-chip supply voltage noise reduction and/or mitigation in accordance with one or more embodiments described herein.

FIG. 1 illustrates a block diagram of an example, non-limiting, system 100 that facilitates on-chip supply voltage noise reduction and/or mitigation in accordance with one or more embodiments described herein. Aspects of systems (e.g., the system 100 and the like), apparatuses, or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described.

In various embodiments, the system 100 can be employed in any type of component, machine, device, facility, apparatus, and/or instrument that comprises a processor and/or can be capable of effective and/or operative communication with a wired and/or wireless network. Components, machines, apparatuses, devices, facilities, and/or instrumentalities that can comprise the system 100 can include tablet computing devices, handheld devices, server class computing machines and/or databases, laptop computers, notebook computers, desktop computers, cell phones, smart phones, consumer appliances and/or instrumentation, industrial and/or commercial devices, hand-held devices, digital assistants, multimedia Internet enabled phones, multimedia players, and the like.

As illustrated, the system 100 can comprise a processor core 102, which can be divided into one or more units, illustrated as a first unit 104 and a second unit 106. The first unit 104 can comprise a first voltage noise sensor 108 and a first local controller 110. The second unit 106 can comprise a second voltage noise sensor 112 and a second local controller 114. Further, the processor core 102 can comprise a global controller 116 and at least one memory 118. The global controller 116 can be at a centralized point within the processor core 102. For example, the global controller 116 can be located at an edge of the processor core 102.

The first voltage noise sensor 108 can detect a first voltage droop at the first unit 104. Based on the detection of the first voltage droop, the first voltage noise sensor 108 can transmit information related to the first voltage droop to the first local controller 110 and to the global controller 116. For example, upon or after detection of the first voltage droop, the first voltage noise sensor 108 can send a first signal to the first local controller 110 over a local control loop. Further, the first voltage noise sensor 108 can send a second signal to the global controller 116 over a global control loop. The local control loop remains internal to the first unit 104 (e.g., does not need to interface with other units of the processor core). Due to the local nature of the local control loop, the first local controller 110 can receive the information from the first local controller 110 in a shorter amount of time than it takes the information to be received by the global controller 116. Based on this shorter amount of time, the first local controller 110 can implement a first noise mitigation procedure, which can reduce a lag time between when the first voltage droop is detected and when a noise mitigation procedure is implemented. The first noise mitigation procedure implemented by the first local controller 110 can be conveyed to the second local controller 114 and the global controller 116.

The global controller 116 upon or after receiving the indication from the first voltage noise sensor 108 can determine if a global countermeasure procedure should be implemented within the processor core 102. For example, the determination can be made based on whether the local mitigation procedure implemented by the first local controller 110 resolved the detected voltage droop. If resolved, the global controller 116 can selectively ignore the received indication. However, if the voltage droop is not resolved, the global controller 116 can selectively implement a global reduction/mitigation countermeasure procedure at the first unit 104, at the second unit 106, at other portions of the processor core, or combinations thereof. According to some implementations, the global reduction/mitigation countermeasure procedure can be common for the units in the processor core 102. For example, if the clock frequency is down 50%, the global reduction/mitigation countermeasure procedure can be an instruction to throttle the core's activity to 25%. However, according to some implementations, the reduction/mitigation countermeasure procedure can be different for the various units of the processor core 102. For example, a first set of instructions provided to the first local controller 110 can be different from a second set of instructions provided to the second local controller 114.

The determination whether the voltage droop has been resolved can be based on another indication received from the first voltage noise sensor 108. For example, as voltage noise is detected by the first voltage noise sensor 108 the information can be transmitted to the first local controller 110 and the global controller 116. In some cases, the information can indicate that the voltage detected is at above the defined voltage level (e.g., no voltage droop detected). Thus, if the global controller 116 receives an indication of a voltage droop at the first unit 104 and thereafter receives another indication that there is no voltage droop at the first unit 104, the global controller 116 can determine that no further action is necessary.

The global reduction/mitigation procedures implemented by the global controller 116 can be different procedures. For example, a first global reduction/mitigation procedure can be implemented at the first unit 104, a second reduction/mitigation procedure can be implemented at the second unit 106, and a third reduction/mitigation procedure can be implemented at another portion of the processor core 102. The first reduction/mitigation procedure and the second reduction/mitigation procedure can be the same reduction/mitigation procedure or different reduction/mitigation procedures. Further, the third reduction/mitigation procedure can be the same as the first reduction/mitigation procedure or the second reduction/mitigation procedure, or can be different from the first reduction/mitigation procedure and the second reduction/mitigation procedure.

In accordance with some implementations, the second voltage noise sensor 112 can detect a second voltage droop at the second unit 106. Thus, the second voltage noise sensor 112 can transmit information related to the second voltage droop to the second local controller 114 over a local control loop (e.g., local to the second unit 106) and to the global controller 116 over the global control loop. Accordingly, the second local controller 114 can implement a second noise mitigation procedure at the second unit 106. Information related to the second noise mitigation procedure can be conveyed to the first local controller 110 and the global controller 116. It is noted that the first voltage droop (detected by the first voltage noise sensor 108) and the second voltage droop (detected by the second voltage noise sensor 112) can be detected concurrently or at different times. Further, the first noise mitigation procedure and the second noise mitigation procedure can be similar procedures or different procedures.

If the second noise mitigation procedure resolves the voltage droop at the second unit 106, the global controller 116 can selectively ignore the indication received from the second voltage noise sensor 112. However, if the voltage droop is not resolved, the global controller 116 can implement one or more global reduction/mitigation procedures globally, or at one or more portions of the processor core 102 (e.g., the first unit 104, the second unit 106, another unit, or another portion of the processor core 102).

The at least one memory 118 can store computer executable components and/or computer executable instructions, which can be implemented by the processor core 102. The at least one memory 118 can store protocols associated with implementing on-chip supply noise voltage reduction/mitigation as discussed herein. Further, the at least one memory 118 can facilitate action to control communication between the first unit 104, the second unit 106, and the global controller 116, such that the system 100 can employ stored protocols and/or algorithms to achieve on-chip supply noise voltage reduction/mitigation as described herein.

Figure 2:
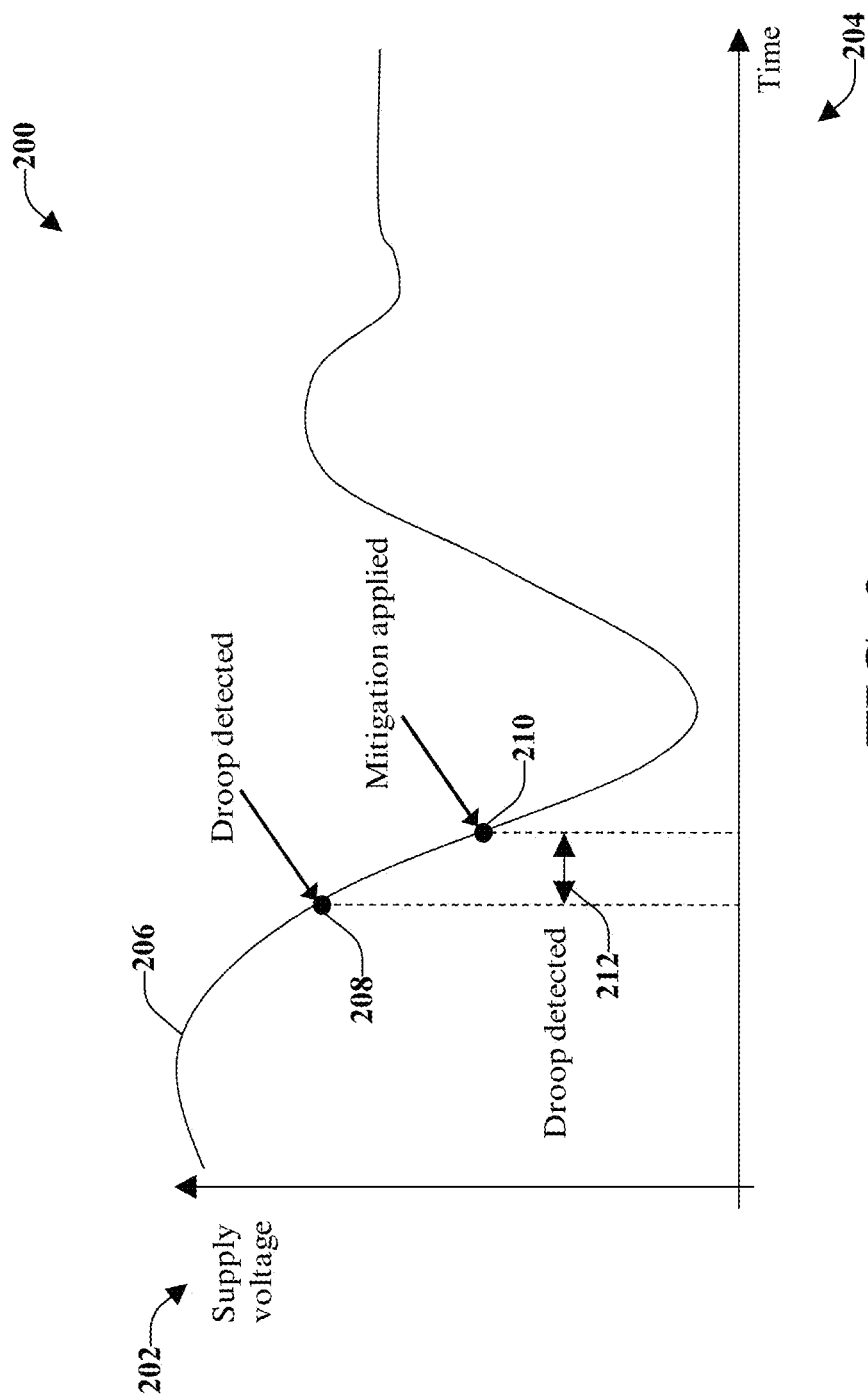
FIG. 2 illustrates an example, non-limiting, chart of voltage droop detection and mitigation that comprises a delay or lag between detection of the voltage droop and implementation of mitigation procedures for a global control loop.

As discussed above, the first local controller 110 in the first unit 104 and/or the second local controller 114 in the second unit 106 can reduce a delay or lag between detection of the respective voltage droop and implementation of a respective local noise mitigation procedure. For example, FIG. 2 illustrates an example, non-limiting, chart 200 of voltage droop detection and mitigation that comprises a delay or lag between detection of the voltage droop and implementation of mitigation procedures for a global control loop. When the supply current drawn by a processor suddenly increases, a large drop can be created on the voltage power supply. If the power supply decreases below a determined voltage value, the processor's functionality can be compromised.

As discussed herein, when a global control loop is utilized to inform the global controller (e.g., the global controller 116 of FIG. 1) of the detected voltage droop, it can take a (relatively) long amount of time for the information to traverse the large distance across the processor core. Further, a global countermeasure procedure can be applied for a long amount of time, which can induce a large amount of performance overhead.

A supply voltage level 202 is illustrated on the vertical axis of the chart 200, and time 204 is illustrated on the horizontal axis. The plotted line 206 illustrates a supply voltage value for a processor core (or a portion of the processor core). As the supply voltage value is monitored, a voltage droop can be detected, as indicated at 208. Based on the detection, an indication of the voltage droop can be transmitted over a global loop to the global controller, which can provide instructions for reduction/mitigation of the voltage droop. The reduction/mitigation procedure can be implemented, as indicate at 210, after a time delay. Accordingly, there is a lag 212 between when the voltage droop is detected (at 208) and when reduction/mitigation is applied (at 210). The lag 212 (or time delay) can be of a duration that is long enough to slow down the processor, which can be noticeable at the device. The lag 212 can be introduced as a function of the time for the voltage loop indication to traverse from the sensor to the global controller. The lag 212 also includes the time for the instructions to traverse from the global controller and be applied at the respective unit. Further, the lag 212 can be due to the signals transferring across large distances and the processing time spent to combine many signals coming from multiple sensors (e.g., the first voltage noise sensor 108, the second voltage noise sensor 112, and so on). During these delays, the supply is dropping further, and the functionality of sensitive structures, such as like arrays, could be compromised. The various aspects provided herein reduce the delay through the implementation of local controllers and local control loops in order to implement one or more local noise mitigation procedures.

Figure 3:
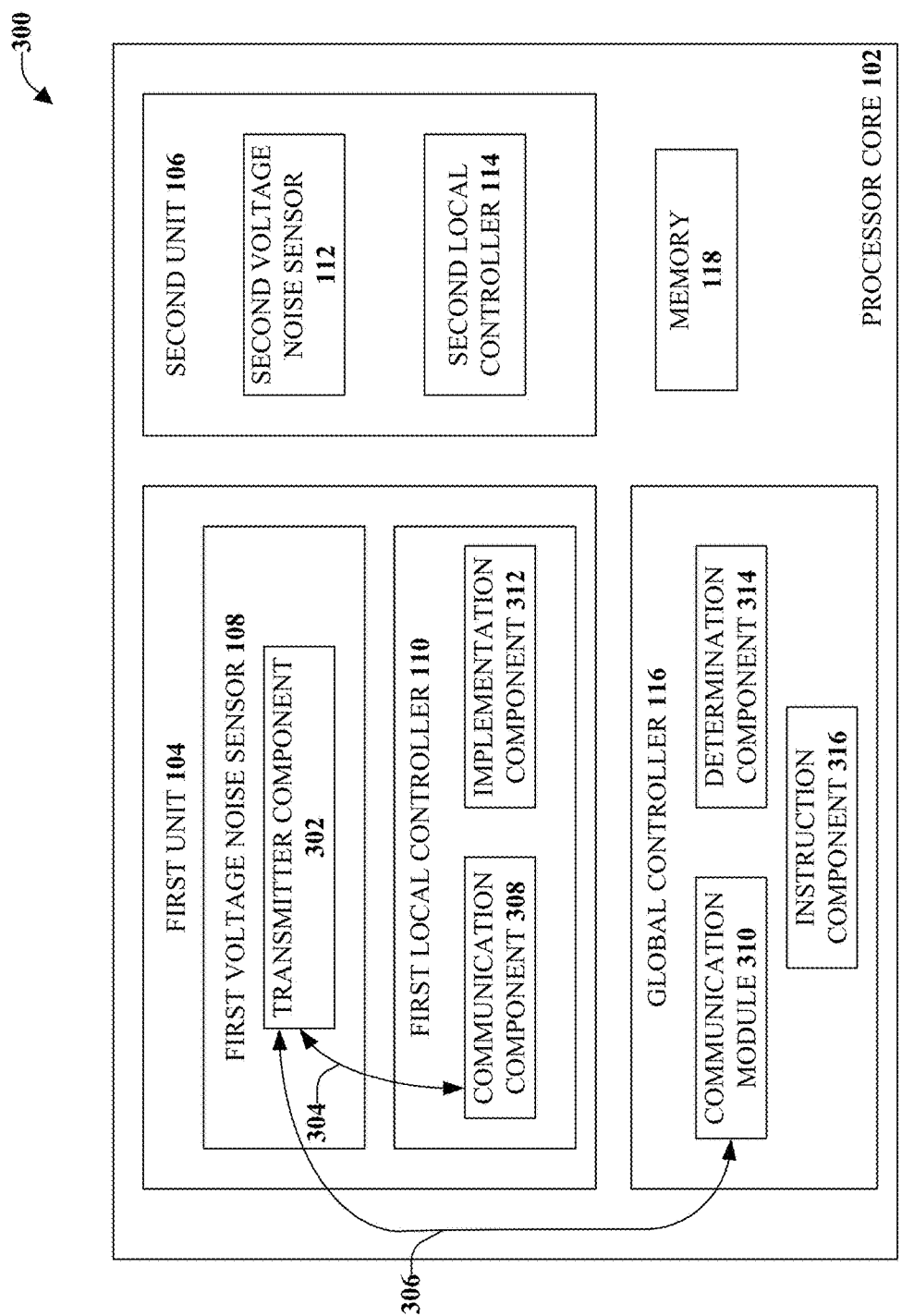
FIG. 3 illustrates a block diagram of an example, non-limiting, system that facilitates implementation of one or more corrective procedures in response to one or more voltage droops detected in a processor core in accordance with one or more embodiments described herein.

FIG. 3 illustrates a block diagram of an example, non-limiting, system 300 that facilitates implementation of one or more corrective procedures in response to one or more voltage droops detected in a processor core in accordance with one or more embodiments described herein. Repetitive description of like elements employed in other embodiments described herein is omitted for sake of brevity.

The system 300 can comprise one or more of the components and/or functionality of the system 100, and vice versa. The first voltage noise sensor 108 can comprise a transmitter component 302 that can send one or more indications of a detected voltage droop over a local control loop 304 and over a global control loop 306. The one or more indications can be sent by the transmitter component 302 concurrently. For example, upon or after the transmitter component 302 sends the indication over the local control loop 304, the transmitter component 302 can send the indication over the global control loop 306.

The first local controller 110 can receive the indication via a communication component 308. The receipt by the communication component 308, over the local control loop 304, can be quicker than receipt of the indication by the global controller 116 over the global control loop 306 via a communication module 310. For example, since the indication conveyed over the local control loop 304 remains internal to the first unit 104, the indication can be received faster due to the close proximity between the first voltage noise sensor 108 and the first local controller 110. On the other hand, the indication over the global control loop 306 has to traverse out of the first unit 104 to another portion of the processor core 102 (e.g., to a location of the global controller 116). Thus, the indication to the global controller 116 can take a longer amount of time, and a further delay can be introduced based on the amount of time for the instruction from the global controller 116 to be received at the first unit 104.

Based, at least in part, on the indication received at the communication component 308, an implementation component 312 can selectively apply one or more local reduction/mitigation countermeasures at the first unit 104. The first voltage noise sensor 108 can continue to monitor the voltage level within the first unit 104 during, and after, implementation of the one or more local reduction/mitigation countermeasures. Information related to the additional voltage levels monitored can be sent by the transmitter component 302 over the local control loop 304 (e.g., to the first local controller 110) and over the global control loop 306 (e.g., to the global controller 116).

If the one or more local reduction/mitigation countermeasures selectively applied by the implementation component 312 resolved the original detected voltage droop, and no subsequent voltage droop is detected, a determination component 314 at the global controller 116 can determine that no further action is necessary. However, if the one or more local reduction/mitigation countermeasures did not resolve the original detected voltage droop, or if another voltage droop is detected at the first unit (e.g., by the first voltage noise sensor 108 or by another voltage noise sensor in the first unit 104), the global controller 116 can implement one or more global procedures.

According to an implementation, the global controller 116 can include an instruction component 316 that can determine one or more global reduction/mitigation countermeasures that should be implemented in one or more portions of the processor core 102. For example, the instruction component 316 can select a first global reduction/mitigation countermeasure to apply at the first unit 104. Additionally or alternatively, the instruction component 316 can select a second global reduction/mitigation countermeasure to apply at the second unit 106. Additionally or alternatively, the instruction component 316 can select a subsequent global reduction/mitigation countermeasure to apply at a subsequent unit (not shown). According to some implementations, the instruction component 316 can determine a global reduction/mitigation countermeasure should be applied globally, across all units of the processor core 102.

In some implementations two or more of the first global reduction/mitigation countermeasure, the second global reduction/mitigation countermeasure, and the subsequent global reduction/mitigation countermeasure can be the same global reduction/mitigation countermeasure. However, according to some implementations, the first global reduction/mitigation countermeasure, the second global reduction/mitigation countermeasure, and the subsequent global reduction/mitigation countermeasure can be different global reduction/mitigation countermeasures.

The global reduction/mitigation countermeasures provided by the instruction component 316 can override one or more local reduction/mitigation countermeasures being applied locally at the different units (e.g., the first unit 104, the second unit 106, the subsequent unit) of the processor core 102. For example, a first local reduction/mitigation countermeasure is being applied by the implementation component 312 and a global reduction/mitigation countermeasure is received from the instruction component 318. In this situation, the implementation component 312 discontinues the application of the first local reduction/mitigation countermeasure and applies the global reduction/mitigation countermeasure.

It is noted that although not specifically indicated, the second unit 106 and subsequent units (not shown) can include the one or more of the components and/or functionality of the first unit 104. For example, the second unit 106 and/or a subsequent unit can include respective transmitter components, respective communication components, and respective implementation components. Further, other processor cores of a processor can include one or more of the components and/or functionality of the processor core 102.

Figure 4:
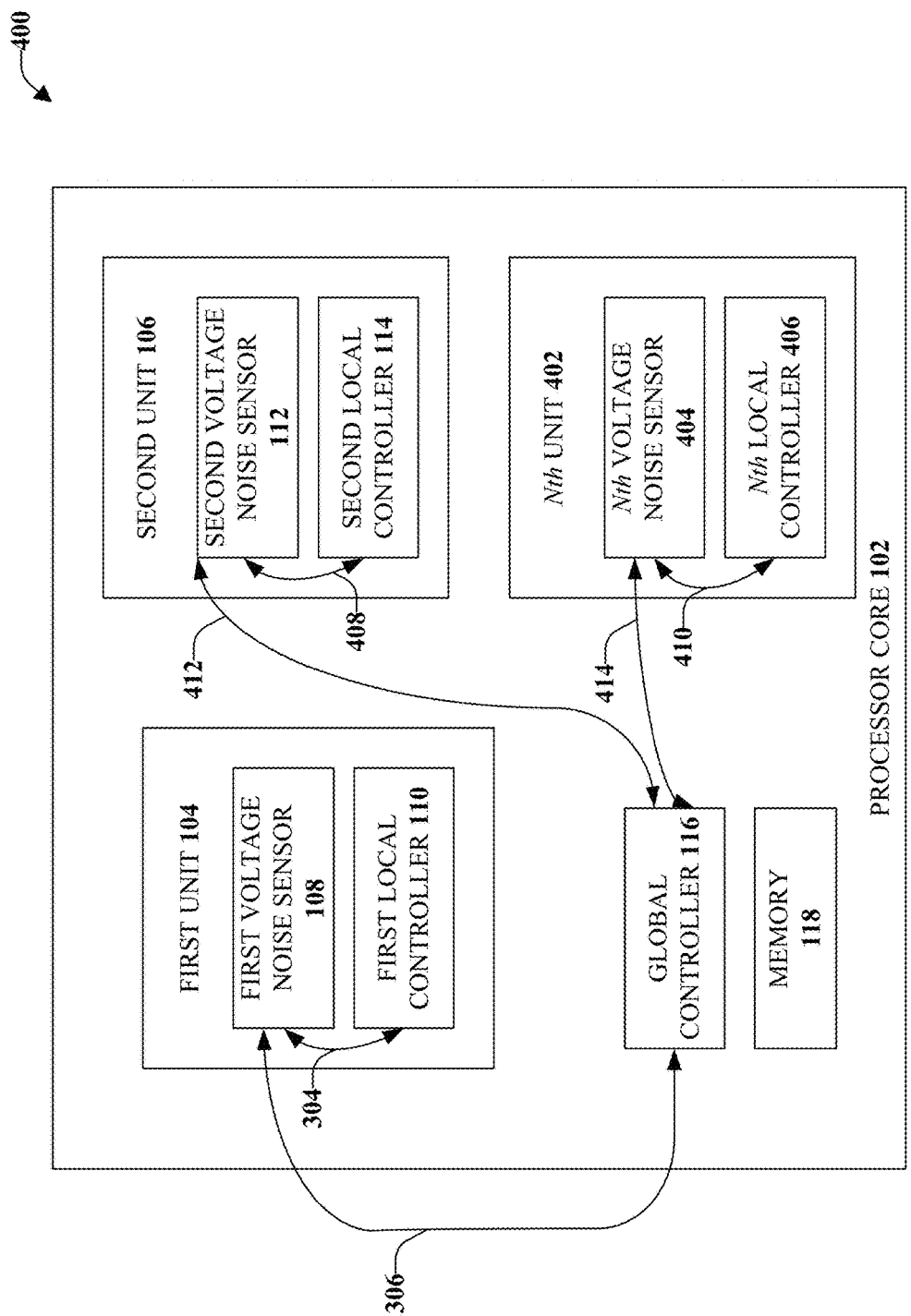
FIG. 4 illustrates a block diagram of an example, non-limiting, system that facilitates on-chip supply noise voltage reduction and/or mitigation using multiple detection/mitigation loops per core in accordance with one or more embodiments described herein.

FIG. 4 illustrates a block diagram of an example, non-limiting, system 400 that facilitates on-chip supply noise voltage reduction and/or mitigation using multiple detection/mitigation loops per core in accordance with one or more embodiments described herein. Repetitive description of like elements employed in other embodiments described herein is omitted for sake of brevity.

The system 400 can comprise one or more of the components and/or functionality of the system 100, the system 300, and vice versa. As illustrated, the processor core 102 can include two or more units, illustrated as the first unit 104, the second unit, and an Nth unit 402, where N is an integer. For example, the processor core 102 can comprise three or more units according to some implementations.

The Nth unit 402 can comprise an Nth voltage noise sensor 404 and an Nth controller 406. As discussed above, the Nth unit 402 can include one or more of the components and/or functionality of the first unit 104, as illustrated and described with respect to FIG. 3

The first unit 104 can comprise one or more local control loops (e.g., the local control loop 304). The second unit 106 can comprise one or more local control loops, illustrated as a local control loop 408. Further, the Nth unit 402 can comprise one or more local control loops, illustrated as a local control loop 410. In addition, the first unit 104 can communicate with the global controller 116 over the global control loop 306. Further, the second unit 106 can communicate with the global controller 116 over a global control loop 412, and the Nth unit 402 can communicate with the global controller 116 over a global control loop 414.

As discussed herein, by incorporating multiple inner (fast) control loops and outer (slow) loops of droop detection/mitigation the various aspects can reduce/mitigate power supply drops and can prevent/reduce timing failures in a processor core (e.g., the processor core 102). For example, the multiple inner (fast) control loops can include the local control loop 304 of the first unit 104, the local control loop 408 of the second unit 106, and the local control loop 410 of the Nth unit 402. As indicated above, the units can comprise more than one local control loop (as will be discussed in further detail with respect to FIG. 5 below). The outer (slow) loops can include the global control loop 306, the global control loop 412, and the global control loop 414.

The multiple inner (fast) control loops and the outer (slow) loops can be independent loops. Further, loops of the one or more loops (local and global) can be configured to handle one or more types of droop events and perform a different mitigation countermeasure. By usage of these independent loops, the various aspects can de-couple the performance loss from the mitigation countermeasure from the coverage of the droop detection. This can facilitate faster and more efficient droop detection. For example, since there are multiple loops, different types of voltage droops can be identified and different (and potentially less-performance-costly) countermeasures can be applied. Further, usage of the independent local loops as discussed herein can facilitate efficiencies that can result in minimal performance overhead.

Figure 5:
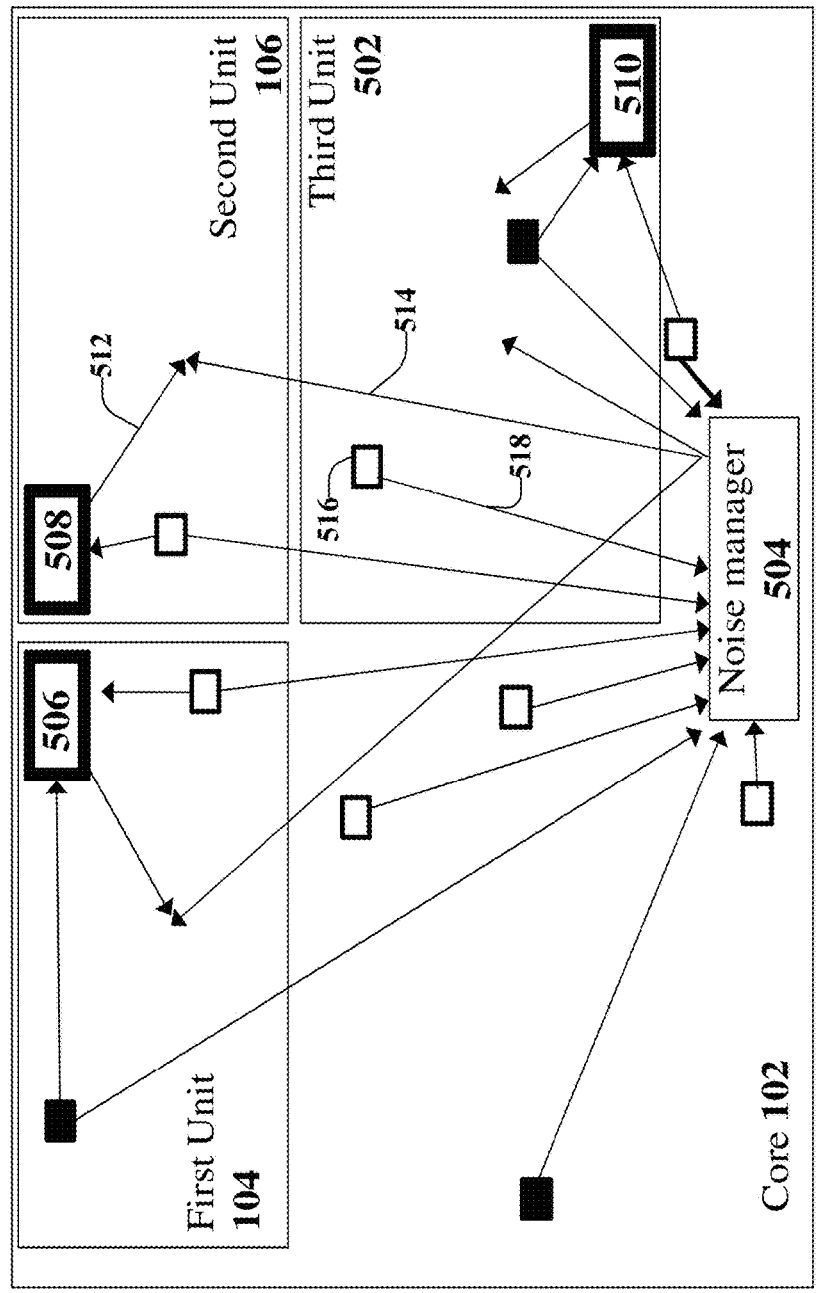
FIG. 5 illustrates a block diagram of an example, non-limiting, system utilized for droop detection and mitigation in accordance with one or more embodiments described herein.

FIG. 5 illustrates a block diagram of an example, non-limiting, system 500 utilized for droop detection and mitigation in accordance with one or more embodiments described herein. Repetitive description of like elements employed in other embodiments described herein is omitted for sake of brevity.

The system 500 can comprise one or more of the components and/or functionality of the system 100, the system 300, the system, 400, and vice versa. As illustrated, the processor core 102 can comprise a global noise manager component 504 (e.g., the global controller 116 of FIG. 1). Further, the processor core 102 can be divided into one or more units, such as the first unit 104 (Unit 1), the second unit 106 (Unit 2), and a third unit 502 (Unit 3).

In this example, various noise sensor/estimator devices can be included in the processor core 102. Supply voltage droop sensors are represented in FIG. 5 by the unfilled small squares. For example, the first unit 104 comprises one supply voltage droop sensors (e.g., the first voltage noise sensor 108), the second unit 106 comprises one supply voltage droop sensor (e.g., the second voltage noise sensor 112), and the third unit 502 comprises one supply voltage droop sensor (not labeled).

Also included in the processor core 102 can be other noise sensors/estimators, represented by the filled small squares. In the illustrated example, the first unit 104 can comprise another noise sensor/estimator, the third unit 502 comprises another noise sensor/estimator, and the processor core 102 (not associated with a unit) comprises another noise sensor/estimator.

The processor core 102 can also comprise a global noise manager component 504 (e.g., the global controller 116). Further, the first unit 104 can comprise a local noise manager component 506 (e.g., the first local controller 110), the second unit 106 can comprise a local noise management component 508 (e.g., the second local controller 114), and the third unit 502 can comprises a local noise management unit 510.

As the noise sensors detect noise or a voltage droop, respective signals can be transmitted to the local noise management units and the global noise manager component 504. For example, the second unit 106 comprises a supply droop sensor. Upon or after detection of a voltage droop, the supply droop sensor can transmit a first signal to the local noise management component 508 (e.g., via a local control loop) and the global noise manager component 504 (e.g., via a global control loop), as represented by the outgoing lines from the supply droop sensor. The local noise management component 508 can transmit a signal 512 to start instruction throttling. In addition, the global noise manager component 504 can transmit another signal 514 to start instruction throttling. The signal from the local noise management component 508 can be provided sooner than the signal from the global noise manager component 504 due to the timing of the local control loop as compared to the global control loop as discussed herein.

Further, as indicated by supply droop sensor 516 in the third unit 502, the signal transfer 518 from the supply droop sensor 516 can be to the global noise manager component 504, not to the local noise management unit 510. For example, it could be determined (which can be a pre-defined) that speed efficiencies can be gained by sending the signal from the supply droop sensor 516 directly to the global noise manager component 504, instead of the local noise management unit 510.

As discussed herein, in addition to one slow loop at the core level (e.g., the global control loop), there can be additional faster loops (e.g., local control loops) at a granular level, at different fractions or units of the processor core 102. The local control loops can comprise different detection/sensing procedures (e.g., Critical Path Monitor (CPM) with/without slope, power proxy) and countermeasure target and strength.

By way of example and not limitation, there can be three local loops in a processor core that can be divided into three units. A first local loop can be associated with a first unit, a second local loop can be associated with a second unit, and a third local loop can be associated with a third unit. There can also be a global loop for the entire processor core.

The signal (or instruction) on the first local loop can be to throttle branch prediction to 25%, detect using CPM+slope. The signal (or instruction) on the second local loop can be to throttle dispatch unit to 25%, detect using CPM+slope. The signal (or instruction) on the third local loop can be to throttle issue to 25%, detect using CPM+slope. Further, the local loops can broadcast the signals (instructions) to the other local loops and to the global loop. Further to this example, the instruction on the global loop can be to throttle the entire core if the droop persists for more than a defined number of cycles, such as twenty cycles, for example, (e.g., low-f droops). The global loop can override local loops (because the global loop can be controlled by other effects in addition to the voltage droop detected by the sensor(s)).

According to some implementations, if there is a droop that is only flagged through the less conservative (more aggressive) detection, only ⅙ of the core activity is throttled. Even if the voltage droop is a false positive, with the less conservative approach there can be a minimal performance loss.

Figure 6:
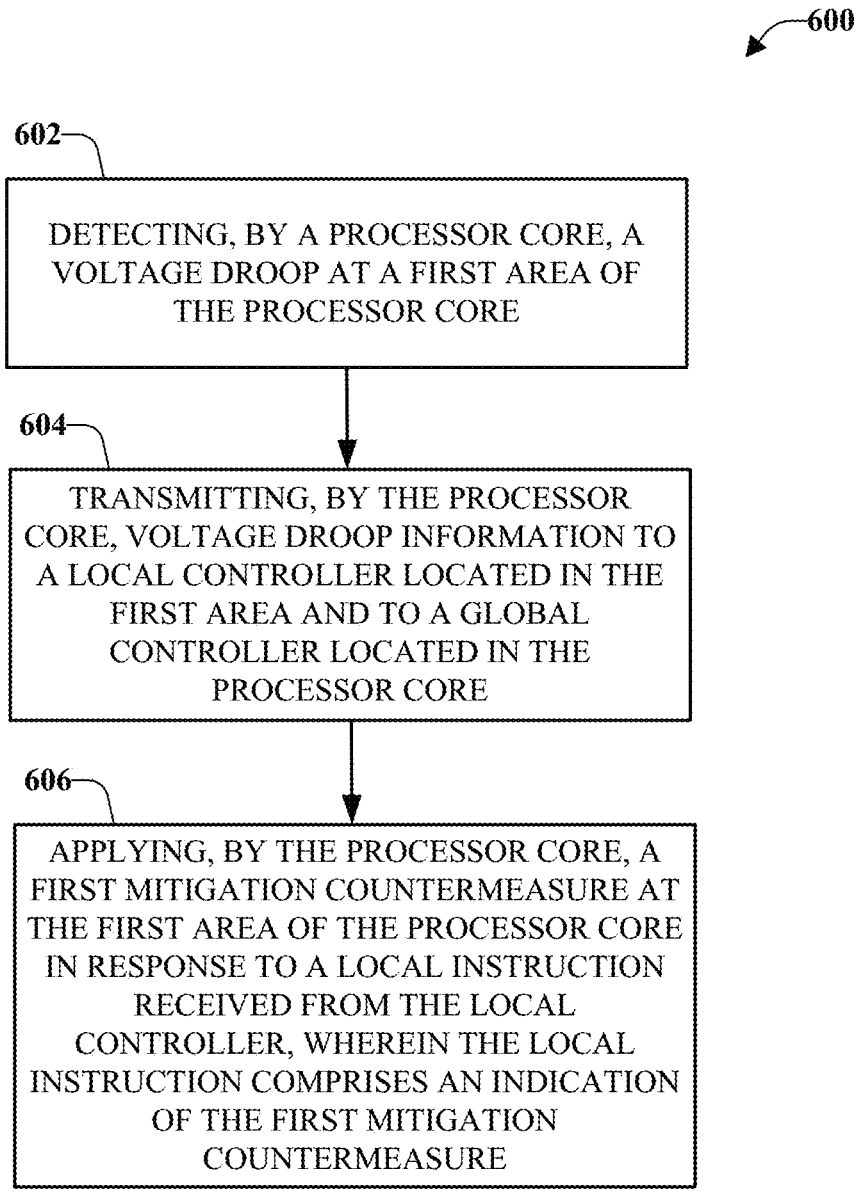
FIG. 6 illustrates a flow diagram of an example, non-limiting, computer-implemented method that facilitates on-chip supply noise voltage reduction and/or mitigation using local detection loops in accordance with one or more embodiments described herein.

FIG. 6 illustrates a flow diagram of an example, non-limiting, computer-implemented method 600 that facilitates on-chip supply noise voltage reduction and/or mitigation using local detection loops in accordance with one or more embodiments described herein. Repetitive description of like elements employed in other embodiments described herein is omitted for sake of brevity.

At 602 of computer-implemented method 600, a voltage droop at a first area of a processor core can be detected (e.g., via the first voltage noise sensor 108). For example, a processor can be divided into two or more different areas or units. Respective voltage noise sensor components can be included in the two or more different areas. For example, a first voltage noise sensor component can be located in a first area, a second voltage noise sensor component can be located in a second area, and a subsequent voltage noise sensor component can be located in a subsequent area. According to some implementations, one or more areas can comprise two or more voltage noise sensor components. Further, areas of the two or more areas can comprise a different quantity of voltage noise sensor components. For example, a first area can comprise one voltage noise sensor component and a second area can comprise three voltage noise sensor components. In another example, a first area can comprise two voltage noise sensor components, a second area can comprise three voltage noise sensor components, and a third area can comprise two voltage noise sensor components.

At 604 of the computer-implemented method 600, voltage droop information can be transmitted to a local controller located in the first area and to a global controller located in the processor core (e.g., via the communication component 308). For example, a first signal that carries the voltage droop information can be transmitted to the local controller over a local control loop (or inner control loop). Further to this example, a second signal that carries the voltage droop information can be transmitted to the global controller over a global control loop (or outer control loop). The local controller can be located within the same area of the processor control as the voltage noise sensor component that transmitted the signal, and the global controller can be located at another area of the processor core. Accordingly, the local control loop can have a first reaction time that can be faster than a second reaction time of the global control loop.

Further, at 606 of the computer-implemented method 600, a first mitigation countermeasure can be applied at the first area of the processor core in response to a local instruction received from the local controller (e.g., via the implementation component 312). The instruction from the local controller can also be provided to other local controllers and to the global controller. For example, since the local control loop can transmit the information faster than the global control loop, the local controller can process the information and provide a reduction/mitigation instruction quicker than the global controller can process the information. Therefore, the instruction received from the local controller can be applied within the local area of the processor core, which can increase a processing efficiency of the processor. In some implementations, the instruction from the local controller can resolve the noise voltage issue. In this situation, there could be no further action taken until another noise voltage is detected and/or if another reduction/mitigation action is necessitated by one or more other noise voltages detected at other areas of the processor core.

Figure 7:
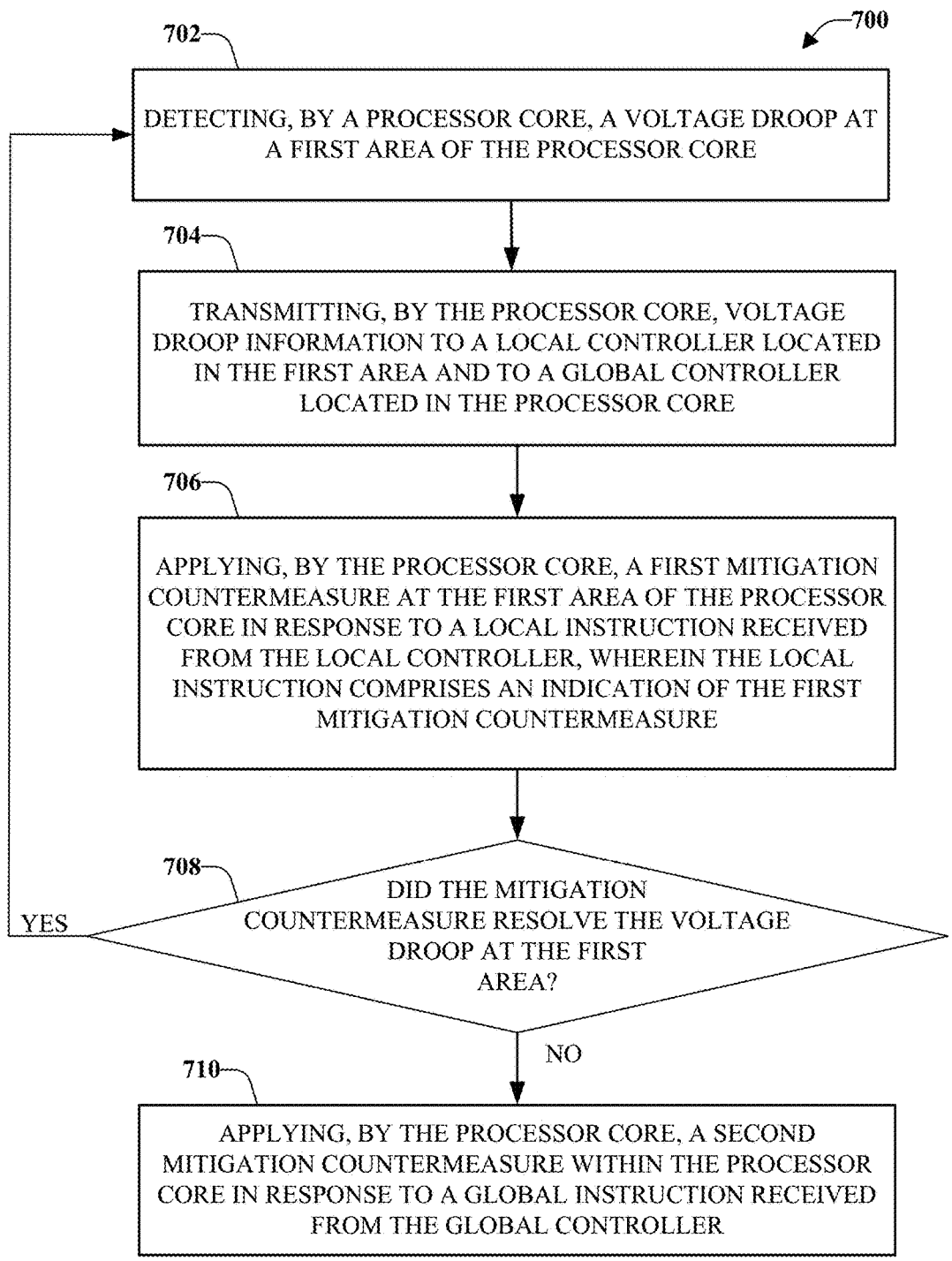
FIG. 7 illustrates a flow diagram of an example, non-limiting, computer-implemented method that implements a global instruction based on an indication that a local instruction did not resolve a voltage droop in accordance with one or more embodiments described herein.

FIG. 7 illustrates a flow diagram of an example, non-limiting, computer-implemented method 700 that implements a global instruction based on an indication that a local instruction did not resolve a voltage droop in accordance with one or more embodiments described herein. Repetitive description of like elements employed in other embodiments described herein is omitted for sake of brevity.

At 702 of computer-implemented method 700, a voltage droop can be detected at a first area of a processor core (e.g., via the first voltage noise sensor 108). According to some implementations, detecting the voltage droop can comprise digitally measuring at least one of a power supply noise value and a slope at a defined voltage value. The power supply noise value and the slope can be associated with the first area of the processor core.

Voltage droop information can be transmitted to a local controller located in the first area and to a global controller located in the processor core, at 704 of computer-implemented method 700 (e.g., via the communication component 308). In an example, transmitting the voltage droop information to the local controller can decreases a performance overhead associated with detection and mitigation of the voltage droop (e.g., a local control loop can be utilized to process information faster than information can be processed using a global control loop).

Further, at 706 of computer-implemented method 700, a first mitigation countermeasure can be applied at the first area of the processor core in response to a local instruction received from the local controller, wherein the local instruction comprises an indication of the first mitigation countermeasure (e.g., via the implementation component 312).

A determination can be made, at 708 of computer-implemented method 700, whether the mitigation countermeasure resolved the voltage droop at the first area (e.g., via the first voltage noise sensor 108). If the voltage droop has been resolved ("YES"), the computer-implemented can stop, or can return to 702 and wait for detection of another voltage droop. Alternatively, if the determination is that the mitigation countermeasure has not resolved the voltage droop at the first area ("NO"), at 710 of computer-implemented method 700, a second mitigation countermeasure can be applied within the processor core in response to a global instruction received from the global controller.

According to some implementations, the second mitigation countermeasure can be applied at the first unit or at another unit within the processor core. For example, applying the second mitigation countermeasure can comprise applying the second mitigation countermeasure at the first area of the processor core. Further to this implementation, a third mitigation countermeasure can be applied at a second area of the processor core. The second mitigation countermeasure and the third mitigation countermeasure can be based on respective instructions received from the global controller. In an implementation, the local instruction received from the local controller can be overridden by the respective instructions received from the global controller.

Figure 8:
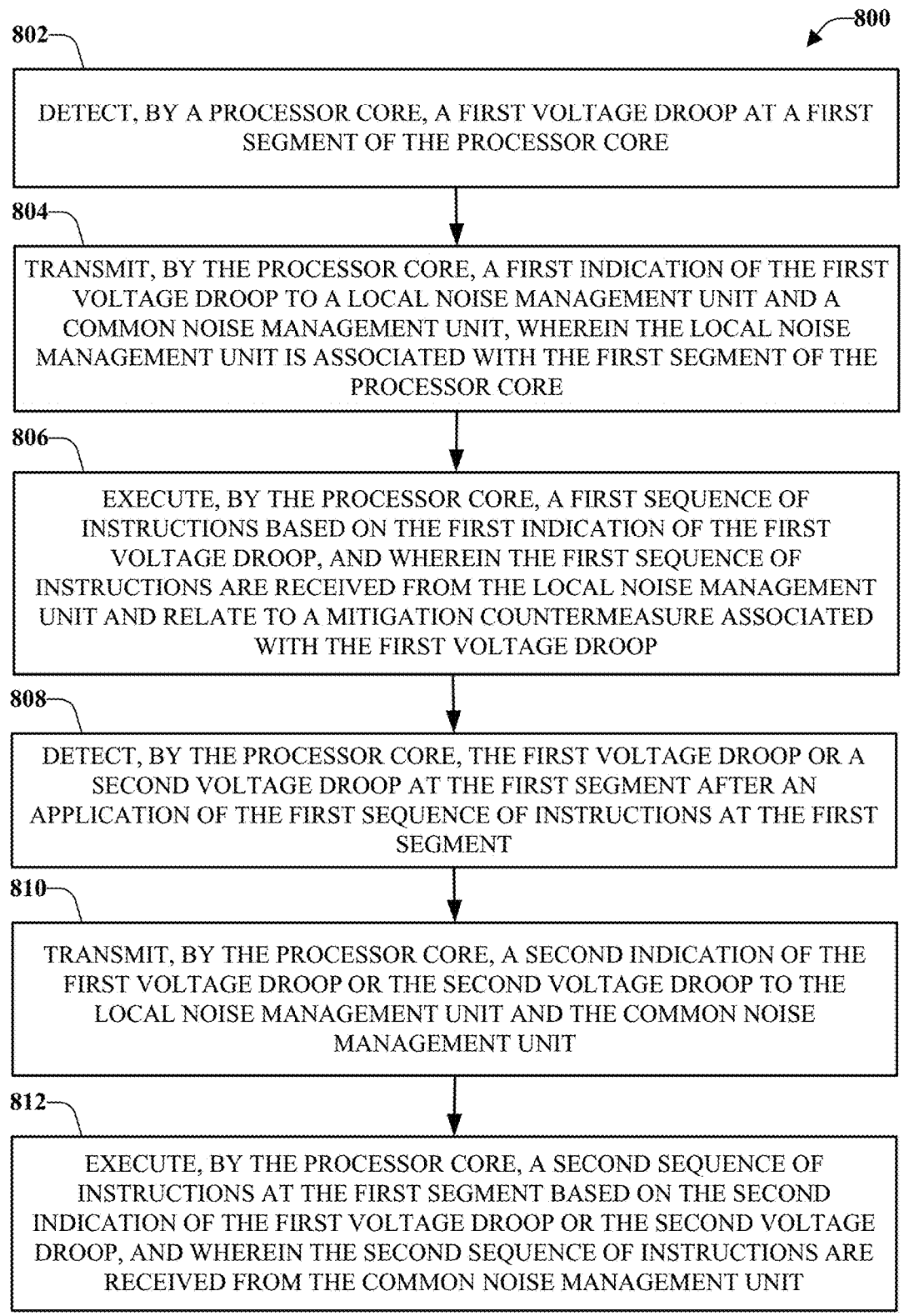
FIG. 8 illustrates a flow diagram of an example, non-limiting, computer-implemented method that implements multiple mitigation countermeasures to reduce/mitigate on-chip supply noise voltage in accordance with one or more embodiments described herein.

FIG. 8 illustrates a flow diagram of an example, non-limiting, computer-implemented method 800 that implements multiple mitigation countermeasures to reduce/mitigate on-chip supply noise voltage in accordance with one or more embodiments described herein. Repetitive description of like elements employed in other embodiments described herein is omitted for sake of brevity.

At 802 of computer-implemented method 800, a first voltage droop at a first segment of the processor core is detected (e.g., via a first voltage noise sensor 108). At 804 of computer-implemented method 800, a first indication of the first voltage droop can be transmitted to a local noise management unit and a common noise management unit (e.g., via the communication component 308). The local noise management unit can be associated with the first segment of the processor core. Further, at 806 of computer-implemented method 800 a first sequence of instructions can be executed based on the first indication of the first voltage droop (e.g., via the implementation component 312). The first sequence of instructions can be received from the local noise management unit and can relate to a mitigation countermeasure associated with the first voltage droop.

At 808 of computer-implemented method 800, the first voltage droop or a second voltage droop can be detected at the first segment after an application of the first sequence of instructions at the first segment (e.g., via the first voltage noise sensor 108). At 810 of computer-implemented method 800, a second indication of the first voltage droop or the second voltage droop can be transmitted to the local noise management unit and the common noise management unit (e.g., via the communication component 308). Further, at 812 of computer-implemented method 800 a second sequence of instructions can be executed at the first segment based on the second indication of the first voltage droop or the second voltage droop (e.g., via the implementation component 312). The second sequence of instructions can be received from the common noise management unit. According to some implementations, the second sequence of instructions can override the first sequence of instructions at the first segment.

Figure 9:
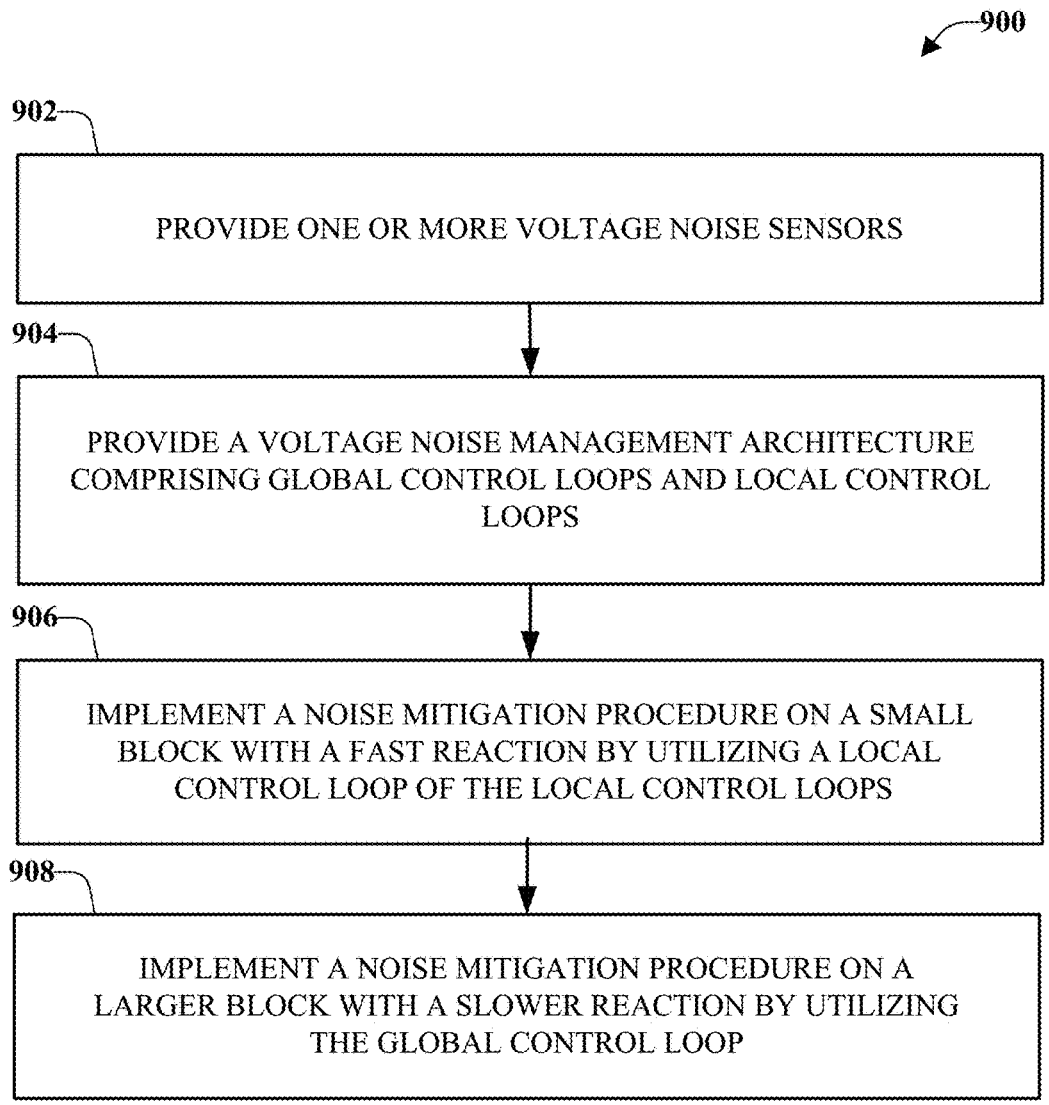
FIG. 9 illustrates a flow diagram of an example, non-limiting, computer-implemented method that reduces/mitigates on-chip power supply noise in accordance with one or more embodiments described herein.

FIG. 9 illustrates a flow diagram of an example, non-limiting, computer-implemented method 900 that reduces/mitigates on-chip power supply noise in accordance with one or more embodiments described herein. Repetitive description of like elements employed in other embodiments described herein is omitted for sake of brevity.

At 902 of computer-implemented method 900, a plurality of voltage noise sensors can be provided in a processor core (e.g., via the first voltage noise sensor 108, the second voltage noise sensor 112, or the Nth voltage noise sensor 404). Voltage noise sensors of the plurality of voltage noise sensors can digitally measure a power supply noise value and/or slope (at known or approximated voltage values).

Further, at 904 of computer-implemented method 900, a voltage noise management architecture can be provided. The voltage noise architecture can comprise global (e.g., slow reaction) control loops and local (e.g., faster reaction) control loops.

At 906 of computer-implemented method 900, a noise mitigation procedure can be implemented on a small block with a fast reaction through utilization of a local control loop of the plurality of local control loops (e.g., via the local control loop 304, the local control loop 408, or the local control loop 410. The "fast reaction" is relative to another reaction provided by the global control loop.

Additionally, at 908 of computer-implemented method, a noise mitigation procedure on a larger block with a slower reaction can be implemented through utilization of a global loop (e.g., the global control loop 306, the global control loop 412, and the global control loop 414). The global loop can utilize a larger number (or quantity) of power supply noise sensors than the number utilized by the local loops. Further, the reaction time of the global loop can be slower in comparison with reaction times of the local loops.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
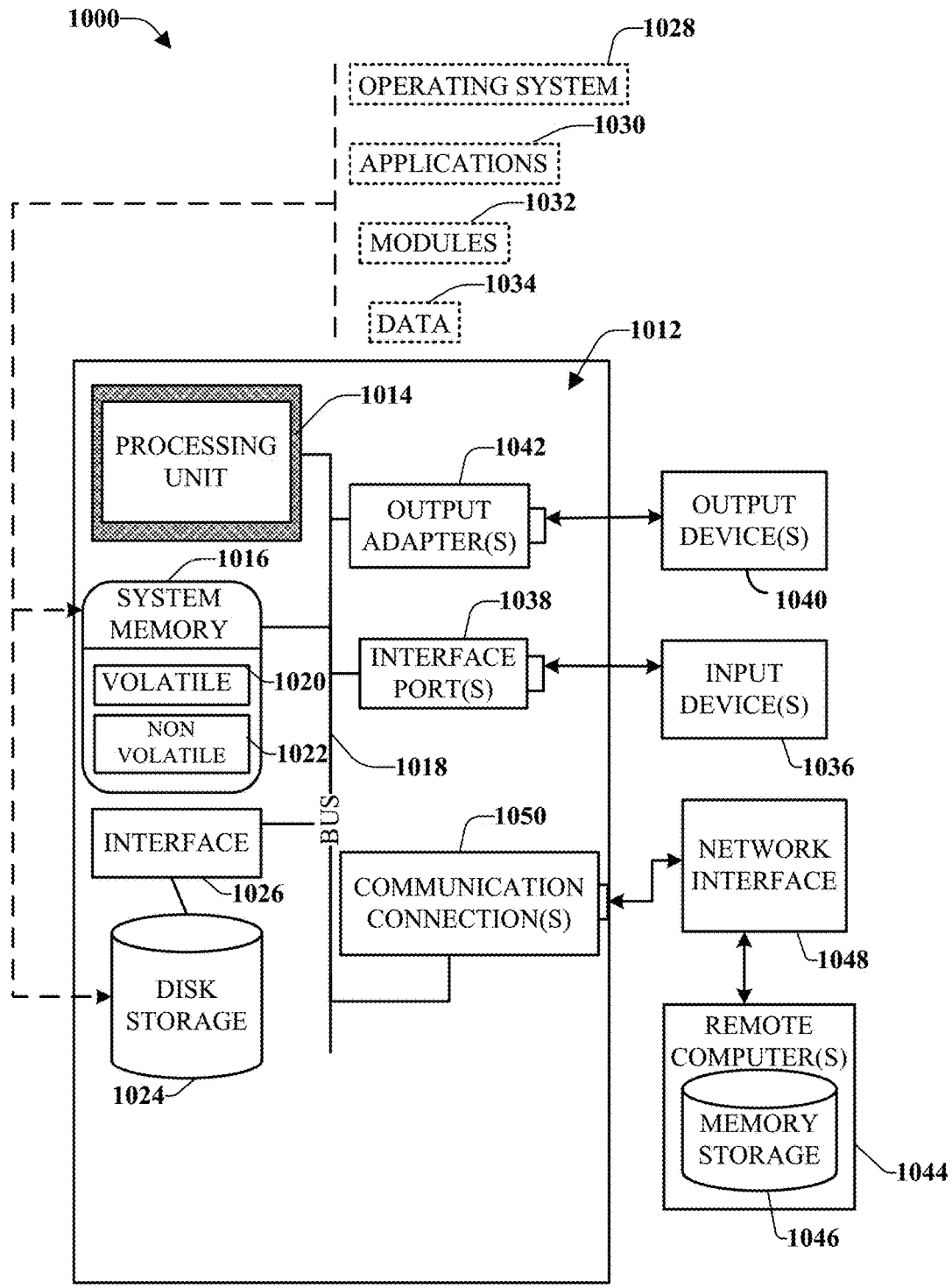
FIG. 10 illustrates a block diagram of an example, non-limiting, operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity. With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a method of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible embodiments of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative embodiments, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
    detecting, by a processor core, a voltage droop at a first area of the processor core;
    transmitting, by the processor core, voltage droop information concurrently to a local controller located in the first area and to a global controller located in the processor core, wherein the local controller is associated with a local control loop of the first area, the global controller is associated with a global control loop of the processor core, and the local controller is distinct from the global controller; and
    applying, by the processor core, a first mitigation countermeasure at the local loop of the first area of the processor core in response to a local instruction received from the local controller, wherein the local instruction comprises an indication of the first mitigation countermeasure.

2. The computer-implemented method of claim 1, further comprising:
    determining, by the processor core, the first mitigation countermeasure did not resolve the voltage droop at the first area; and
    applying, by the processor core, a second mitigation countermeasure within the global control loop of the processor core in response to a global instruction received from the global controller.

3. The computer-implemented method of claim 2, wherein the applying the second mitigation countermeasure comprises:
    applying, by the processor core, the second mitigation countermeasure at the first area of the processor core; and
    applying, by the processor core, a third mitigation countermeasure at a second area of the processor core via the global control loop, and wherein the second mitigation countermeasure and the third mitigation countermeasure are based on respective instructions received from the global controller.

4. The computer-implemented method of claim 3, further comprising overriding, by the processor core, the local instruction received from the local controller with the respective instructions received from the global controller.

5. The computer-implemented method of claim 1, wherein the detecting the voltage droop comprises digitally measuring, by the processor core, at least one of a power supply noise value and a slope at a determined voltage value, and wherein the power supply noise value and the slope are associated with the first area of the processor core.

6. The computer-implemented method of claim 1, wherein the transmitting voltage droop information to the local controller decreases a performance overhead associated with detection and mitigation of the voltage droop.

* * * * *